(12) United States Patent
Lou et al.

(10) Patent No.: US 12,402,503 B2
(45) Date of Patent: Aug. 26, 2025

(54) DISPLAY DEVICES AND OLED DISPLAY PANELS THEREOF

(71) Applicant: Kunshan Go-Visionox Opto-Electronics Co., Ltd., Jiangsu (CN)

(72) Inventors: Junhui Lou, Jiangsu (CN); Long Chen, Jiangsu (CN); Weidong He, Jiangsu (CN); Daxi Deng, Jiangsu (CN); Xiangqian Wang, Jiangsu (CN); Shuai Chen, Jiangsu (CN)

(73) Assignee: Kunshan Go-Visionox Opto-Electronics Co., Ltd. (CN)

( * ) Notice: Subject to any disclaimer, the term of this patent is extended or adjusted under 35 U.S.C. 154(b) by 717 days.

(21) Appl. No.: 17/318,546

(22) Filed: May 12, 2021

(65) Prior Publication Data

US 2021/0265596 A1 Aug. 26, 2021

Related U.S. Application Data

(63) Continuation of application No. PCT/CN2019/107916, filed on Sep. 25, 2019.

(30) Foreign Application Priority Data

Mar. 29, 2019 (CN) .......................... 201910252024.9

(51) Int. Cl.
*H10K 59/179* (2023.01)
*H10K 50/813* (2023.01)
(Continued)

(52) U.S. Cl.
CPC ......... *H10K 59/179* (2023.02); *H10K 50/813* (2023.02); *H10K 50/822* (2023.02);
(Continued)

(58) Field of Classification Search
CPC ....... G09G 3/3208–3225; H10K 50/86; H10K 50/813; H10K 50/822; H10K 50/828;
(Continued)

(56) References Cited

U.S. PATENT DOCUMENTS

2014/0009720 A1  1/2014 Huang
2017/0090087 A1  3/2017 Goto et al.
(Continued)

FOREIGN PATENT DOCUMENTS

AU  2012258356 A1  12/2012
CN  107144907 A   8/2017
(Continued)

OTHER PUBLICATIONS

Chinese First Office Action—100191 (CN-201910252024.9) with English Translation, dated Apr. 27, 2020, 17 pages.
(Continued)

*Primary Examiner* — Steven B Gauthier
*Assistant Examiner* — Alvin L Lee
(74) *Attorney, Agent, or Firm* — Quarles & Brady LLP

(57) ABSTRACT

The present disclosure relates to a display device and an OLED display panel thereof. The OLED display panel includes a substrate, a first OLED pixel unit and a second OLED pixel unit, an encapsulation layer, a polarizer, and a cover plate, in which an opening of the polarizer between the cover plate and the encapsulation layer is filled with a transparent filler. In a first aspect of the present disclosure, the first OLED pixel unit and the second OLED pixel unit are respectively arranged in a transparent display area and a non-transparent display area, so that when the first OLED pixel unit and the second OLED pixel unit are driven, the transparent display area and the non-transparent display area (Continued)

form a full screen; when the first OLED pixel unit is not driven, the transparent display area performs a light-transmission function.

19 Claims, 8 Drawing Sheets

(51) Int. Cl.
*H10K 50/822* (2023.01)
*H10K 50/828* (2023.01)
*H10K 50/84* (2023.01)
*H10K 50/86* (2023.01)
*H10K 59/12* (2023.01)
*H10K 59/131* (2023.01)
*H10K 59/17* (2023.01)
*H10K 59/40* (2023.01)
*H10K 59/65* (2023.01)
*H10K 59/80* (2023.01)

(52) U.S. Cl.
CPC ......... *H10K 50/828* (2023.02); *H10K 50/841* (2023.02); *H10K 50/86* (2023.02); *H10K 50/865* (2023.02); *H10K 59/12* (2023.02); *H10K 59/131* (2023.02); *H10K 59/17* (2023.02); *H10K 59/40* (2023.02); *H10K 59/65* (2023.02); *H10K 59/80515* (2023.02); *H10K 59/80521* (2023.02); *H10K 59/80524* (2023.02); *H10K 59/873* (2023.02); *H10K 59/8791* (2023.02); *H10K 59/8792* (2023.02)

(58) Field of Classification Search
CPC ........ H10K 59/40; H10K 59/65; H10K 59/10; H10K 50/868
See application file for complete search history.

(56) References Cited

U.S. PATENT DOCUMENTS

| | | | |
|---|---|---|---|
| 2017/0123453 A1* | 5/2017 | Evans, V | H10F 39/184 |
| 2017/0194416 A1* | 7/2017 | Chen | H10K 59/123 |
| 2018/0011373 A1 | 1/2018 | Zhou et al. | |
| 2018/0045866 A1* | 2/2018 | Chae | G02F 1/133553 |
| 2019/0080137 A1* | 3/2019 | Wu | G02F 1/1368 |
| 2020/0066809 A1 | 2/2020 | Liu | |
| 2020/0117034 A1* | 4/2020 | Yin | G06F 1/1605 |
| 2020/0211480 A1 | 7/2020 | Xiang et al. | |
| 2020/0212164 A1* | 7/2020 | Xie | H10K 59/80515 |
| 2020/0233133 A1* | 7/2020 | Osato | G09F 9/30 |
| 2020/0286436 A1* | 9/2020 | Lim | G01J 1/02 |
| 2020/0328373 A1 | 10/2020 | Huang et al. | |
| 2020/0350388 A1* | 11/2020 | Song | H10K 59/65 |
| 2021/0143364 A1* | 5/2021 | Jin | H10K 50/844 |

FOREIGN PATENT DOCUMENTS

| | | | |
|---|---|---|---|
| CN | 107248374 A | | 10/2017 |
| CN | 107359185 A | | 11/2017 |
| CN | 107946341 A | | 4/2018 |
| CN | 108681131 A | | 10/2018 |
| CN | 108717244 A | | 10/2018 |
| CN | 108885376 A | | 11/2018 |
| CN | 208444840 U | | 1/2019 |
| CN | 208622778 U | | 3/2019 |
| EP | 3422091 A1 | | 1/2019 |
| KR | 20180063627 A | * | 12/2010 |
| TW | 201839977 A | | 11/2018 |

OTHER PUBLICATIONS

Chinese Second Office Action—100191 (CN-201910252024.9) with English Translation, dated Jul. 14, 2020, 17 pages.
Chinese Third Office Action—100191 (CN-201910252024.9) with English Translation, dated Oct. 16, 2020, 10 pages.
International Search Report (International Application No. PCT/CN2019/107916) English Translation, dated Dec. 27, 2019, 7 pages.

* cited by examiner

DISPLAY DEVICES AND OLED DISPLAY PANELS THEREOF

CROSS-REFERENCE TO RELATED APPLICATIONS

The present application is a continuation application of the PCT application No. PCT/CN2019/107916, filed on Sep. 25, 2019, which claims priority to Chinese Patent Application No. 201910252024.9, filed on Mar. 29, 2019, and the contents of both applications are herein incorporated by reference in their entireties.

TECHNICAL FIELD

The present disclosure relates to the field of the OLED display technology.

BACKGROUND

With the rapid development of display devices, users have increasingly higher requirements for a proportion of display screen. Since components such as a camera, a sensor, an earpiece, etc., are usually installed at the top of the display screen of the mobile terminal, in the prior art a design scheme of a notch screen is adopted, and a portion of an upper part of the display screen is usually reserved for installing the above components, which affects the overall consistency of the display screen, so that the full-screen display has received more and more attention from the industry.

SUMMARY

An objective of the present disclosure is to provide a display device for a full-screen display and an OLED display panel thereof.

An Organic Light Emitting Diode (OLED) display panel is provided, including: a substrate, comprising a transparent display area and a non-transparent display area; a plurality of first OLED pixel units, arranged in an array and located in the transparent display area; a plurality of second OLED pixel units, located in the non-transparent display area; an encapsulation layer, covering the plurality of first OLED pixel units and the plurality of second OLED pixel units; a polarizer, located on the encapsulation layer and provided with an opening corresponding to the transparent display area; and a cover plate, located on the polarizer; the opening of the polarizer is filled with a transparent filler to form a transparent filler layer.

A display device is provided, including: a device body having a device area; and an OLED display panel according to claim 1, the OLED display panel covering the device body; the device area is located under the transparent display area of the OLED display panel, and a photosensitive device emitting or collecting light through the transparent display area is provided in the device area.

The advantages of the present disclosure include, but are not limited to, the following.

1) In a first aspect, a first OLED pixel unit and a second OLED pixel unit are respectively arranged in a transparent display area and a non-transparent display area, such that when the first OLED pixel unit and the second OLED pixel unit are driven, the transparent display area and the non-transparent display area form a full screen; when the first OLED pixel unit is not driven, the transparent display area performs a light-transmission function, and an optical signal can be collected under the display screen. In a second aspect, an area of the polarizer corresponding to the transparent display area is provided with an opening, which improves the light transmittance. In the third aspect, the opening has a transparent filler, thereby avoiding an entry of dust. In the fourth aspect, a refractive index of the transparent filler is greater than that of air, thereby improving the display effect and remedying a defect of an uneven edge of the polarizer, accordingly reducing a flash phenomenon at the opening of the polarizer.

DETAILED DESCRIPTION

With the rapid development of display devices, users have increasingly higher requirements for a proportion of display screens. Since components such as a camera, a sensor, an earpiece, etc., are usually installed at the top of the display screen of the mobile terminal, in the prior art a design scheme of a notch screen is adopted, and a portion of an upper part of the display screen is usually reserved for installing the above components, which affects the overall consistency of the display screen, so that the full-screen display has received more and more attention from the industry.

In order to make the above objectives, features, and advantages more apparent and easier to understand, specific embodiments of the present disclosure are detailed below with reference to accompanying drawings.

Figure 1:
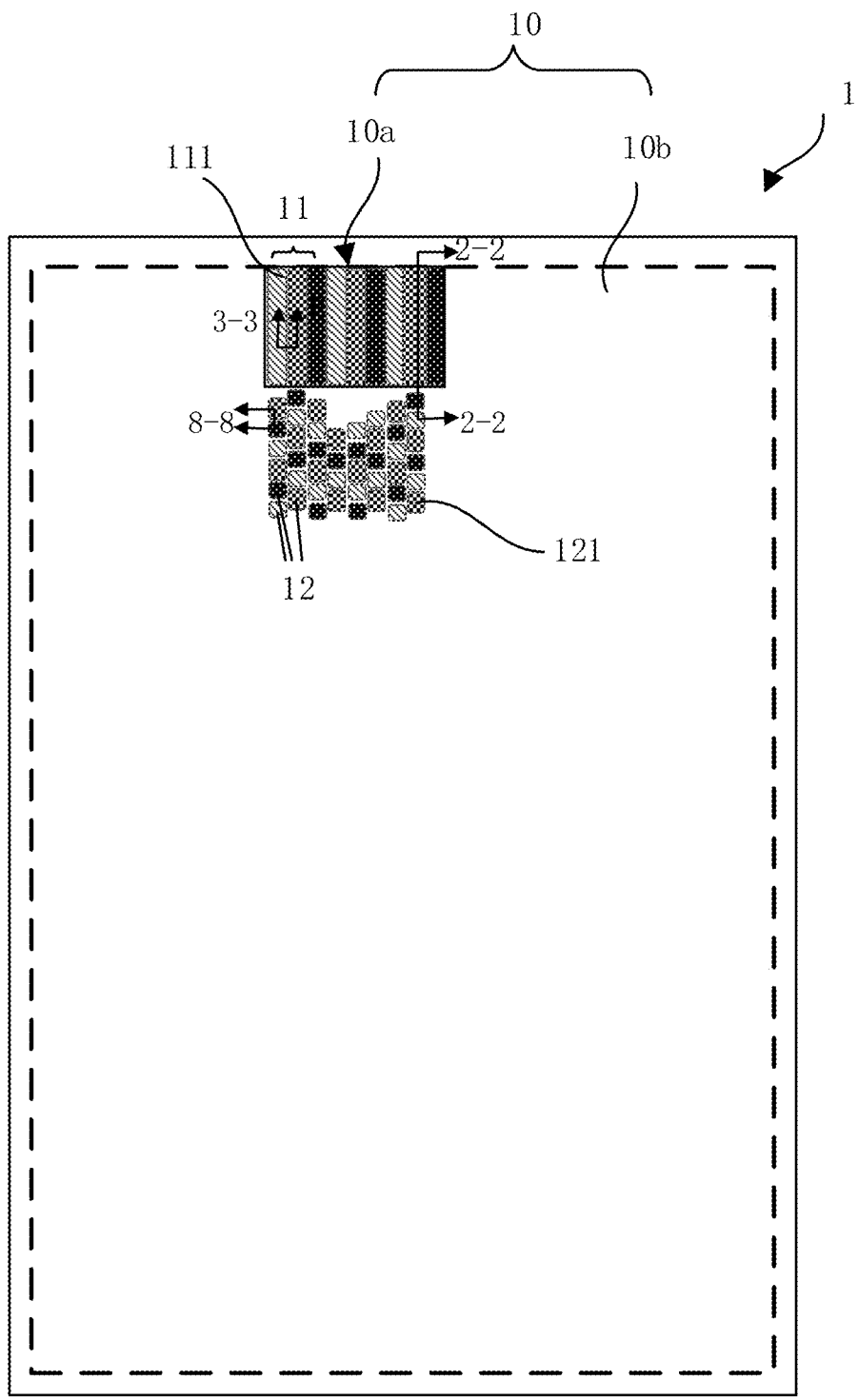
FIG. 1 is a top view of an OLED display panel according to an embodiment I of the present disclosure.
Figure 2:
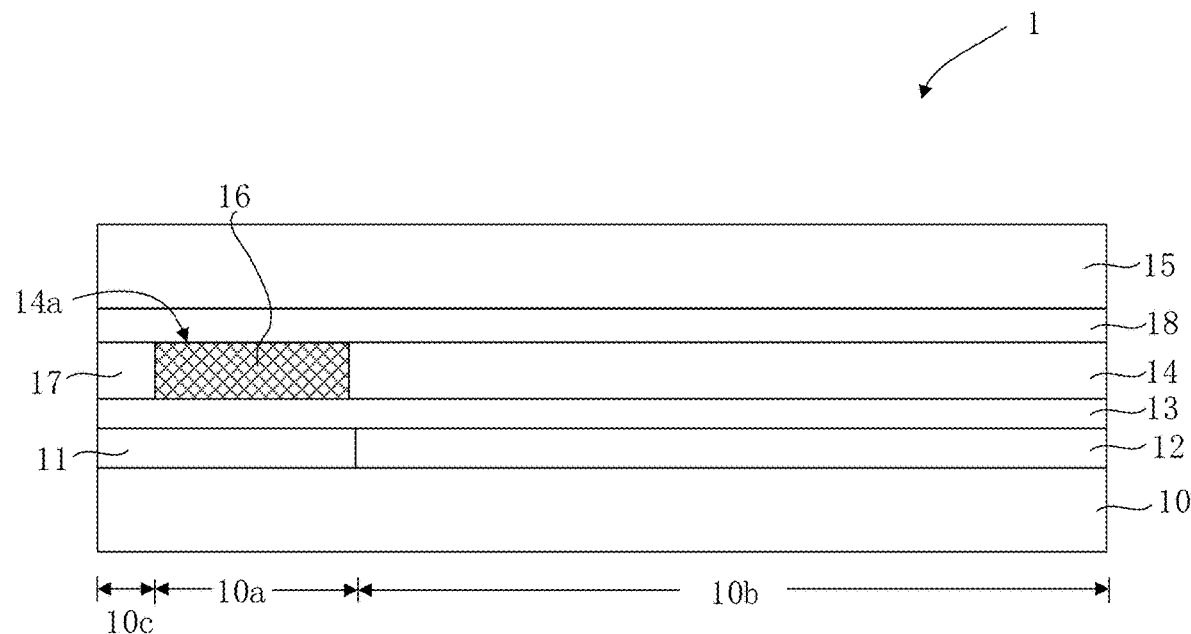
FIG. 2 is a cross-sectional view of the OLED display panel in FIG. 1 taken along a line 2-2.

Referring to FIG. 1 and FIG. 2, the OLED display panel 1 includes: a substrate 10 including a transparent display area 10a and a non-transparent display area 10b; a first OLED pixel unit 11 and a second OLED pixel unit 12, where the first OLED pixel unit 11 is located in the transparent display area 10a, and the second OLED pixel unit 12 is located in the non-transparent display area 10b; an encapsulation layer 13 covering the first OLED pixel unit 11 and the second OLED pixel unit 12; a polarizer 14 located on the encapsulation layer 13, where the polarizer 14 is provided with an opening 14a, and the opening 14a corresponds to the transparent display area 10a; a cover plate 15 located on the polarizer 14, where the polarizer opening 14 between the cover plate 15 and the encapsulation layer 13 is filled with a transparent filler to form a transparent filler layer 16.

Substrate 10 can be a rigid substrate, for example, made of a glass material, or a soft substrate, for example, made of a polyimide (PI) material. A plurality of first OLED pixel units 11 can be arranged in an array. All the first OLED pixel units 11 can be located in the transparent display area 10a. All the second OLED pixel units 12 can be located in the non-transparent display area 10b. The first OLED pixel unit 11 and the second OLED pixel unit 12 may be arranged on the same layer covered by the encapsulation layer 13. The polarizer 14 and the opening 14a are located between cover 15 and encapsulation layer 13.

Figure 3:
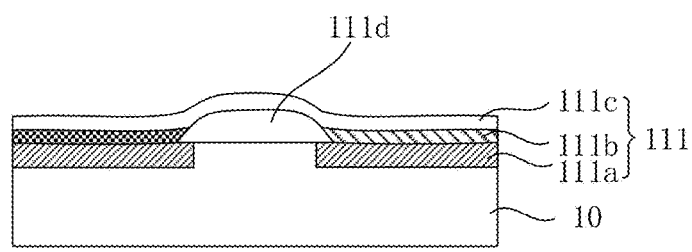
FIG. 3 is a cross-sectional view of the OLED display panel in FIG. 1 taken along a line 3-3, in which an encapsulation layer, a transparent filler layer, and a cover plate are omitted.

Referring to FIG. 3, the first OLED pixel unit 11 includes a plurality of first OLED sub-pixels 111, and each first OLED sub-pixel 111 at least includes: a light-transmission anode 111a, an OLED light-emitting material layer 111b located on the light-transmission anode 111a, and a light-transmission cathode 111c located on the OLED light-emitting material layer 111b. When a driving voltage is applied between the light-transmission anode 111a and the light-transmission cathode 111c of each first OLED sub-pixel 111, the first OLED pixel units 11 arranged in an array perform a display function. When the driving voltage is not applied between the light-transmission anode 111a and the light-transmission cathode 111c of each first OLED sub-pixel 111, the first OLED pixel units 11 arranged in an array perform a light-transmission function.

Referring to FIG. 3, each light-transmission anode 111a can be provided with a pixel definition layer 111d, and the pixel definition layer 111d is provided with an opening, and the OLED light-emitting material layer 111b is located in the opening.

In FIG. 3, the light-transmission anodes 111a in the first OLED pixel units 11 arranged in an array are arranged in one row and multiple columns. In other alternatives, the light-transmission anodes 111a can also be arranged in one column and multiple rows, or can be arranged in a determinant. Compared to the light-transmission block anodes which are arranged in a determinant, the light-transmission anodes 111a arranged in one row and multiple columns can alleviate a problem of light diffraction in upper and lower directions because a pattern between rows is omitted and a pattern in a plane direction is simplified, and accordingly, the light sensor under the transparent display area 10a has a good imaging effect. Similarly, compared to the light-transmission block anodes which are arranged in a determinant, for light-transmission anodes 111a arranged in one column and multiple rows, a pattern between columns is omitted.

Figure 4:
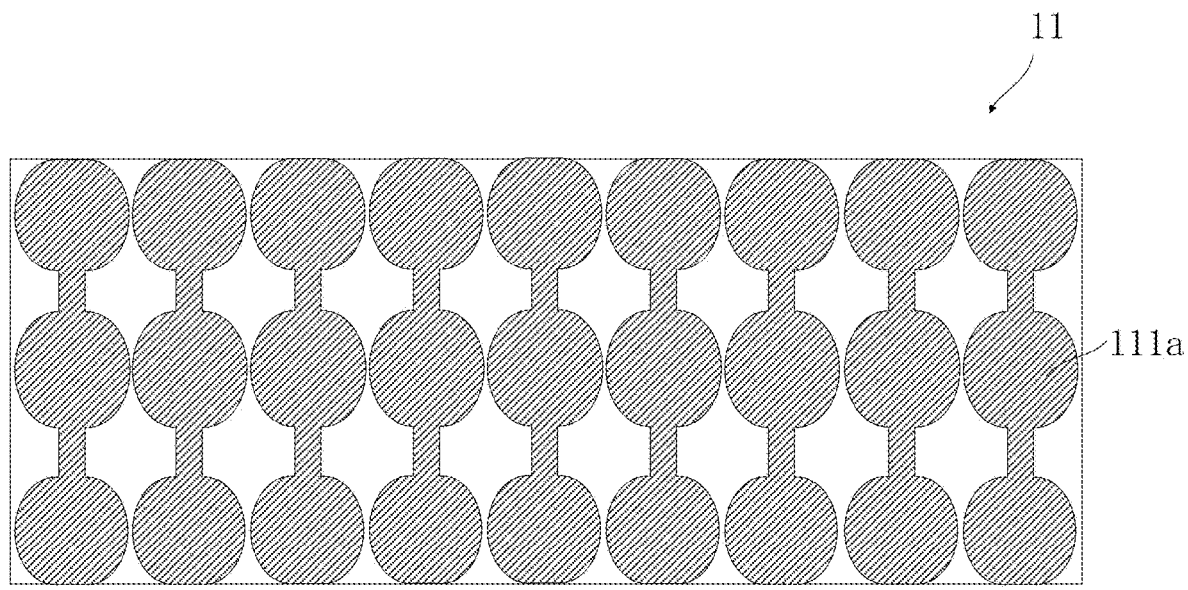
FIG. 4 is a top view of a light-transmission anode in another OLED display panel.
Figure 5:
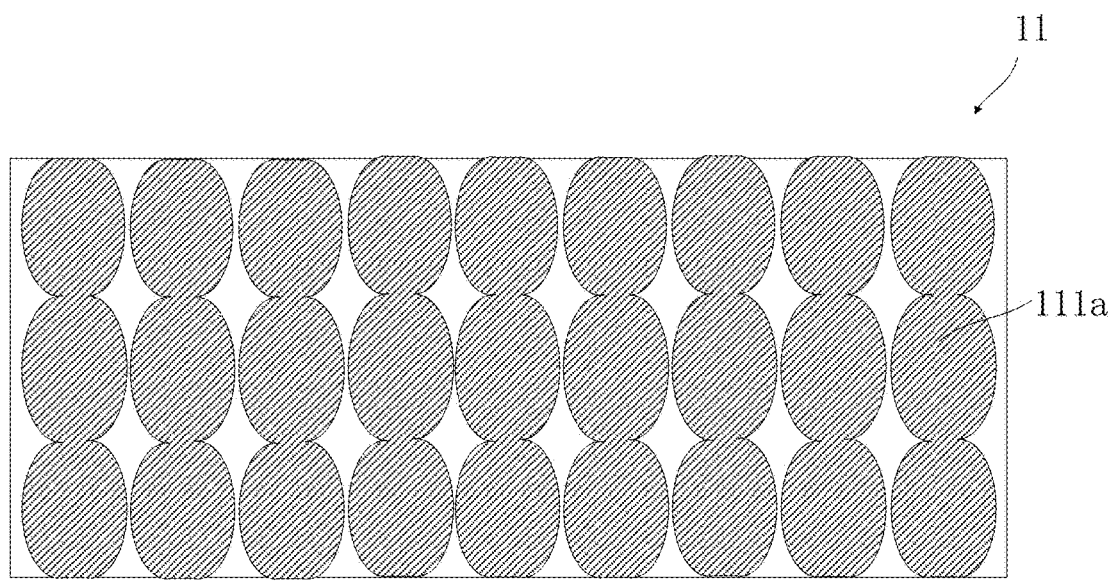
FIG. 5 is a top view of a light-transmission anode in another OLED display panel.

In an embodiment, in the OLED display panel 1 as shown in FIG. 4, each column of light-transmission anodes 111a can be dumbbell-shaped; or in the OLED display panel 1 as shown in FIG. 5, each column of light-transmission anodes 111a can be gourd-shaped. In other alternatives, each column of light-transmission anodes 111a can also be circular or elliptical. All the above shapes can further reduce the diffraction phenomenon.

The OLED light-emitting material layer 111b can have the same shape as the light-transmission anode 111a.

In an embodiment, the light-transmission cathode 111c of the first OLED sub-pixel 111 in each column or row can be a whole planar electrode.

For the first OLED pixel units 11 arranged in an array in the transparent display area, the drive mode can be a) passive drive mode, b) active drive mode, or c) semi-active drive mode.

A Passive Matrix OLED (PMOLED) is simply a matrix with cathodes and anodes, and illuminates the pixels at the intersections of rows and columns in the array in a scanning mode. Each pixel is operated under a short pulse mode, and emits high brightness instantaneously. In other words, the addressing of each OLED sub-pixel is directly controlled by an external circuit.

For solution a), the first OLED pixel units 11 arranged in an array have no pixel drive circuit, a light-transmission anode 111a of each first OLED sub-pixel 111 is connected to the external circuit, and the light-transmission cathode 111c is grounded. The external circuit can be a data signal channel for driving a Display Driver Integrated Chip (DDIC).

An Active Matrix OLED (AMOLED) includes a thin film transistor (TFT) array, and each thin film transistor unit contains a storage capacitor. The AMOLED uses an independent thin film transistor to control the light emission of each pixel, and each pixel can emit light continuously. In other words, the addressing of each OLED sub-pixel is directly controlled by the thin film transistor array. A row selection signal of the thin film transistor array can come from a Gate in Panel (GIP) circuit, and a column selection signal can come from the DDIC.

For the solution a), in an embodiment, the OLED display panel 1 can include multiple rows of light-transmission anodes 111a and multiple columns of light-transmission cathodes 111c, or include multiple columns of light-transmission anodes 111a and multiple rows of light-transmission cathodes 111c, to select the first OLED sub-pixel 111 at the intersection.

Figure 6:
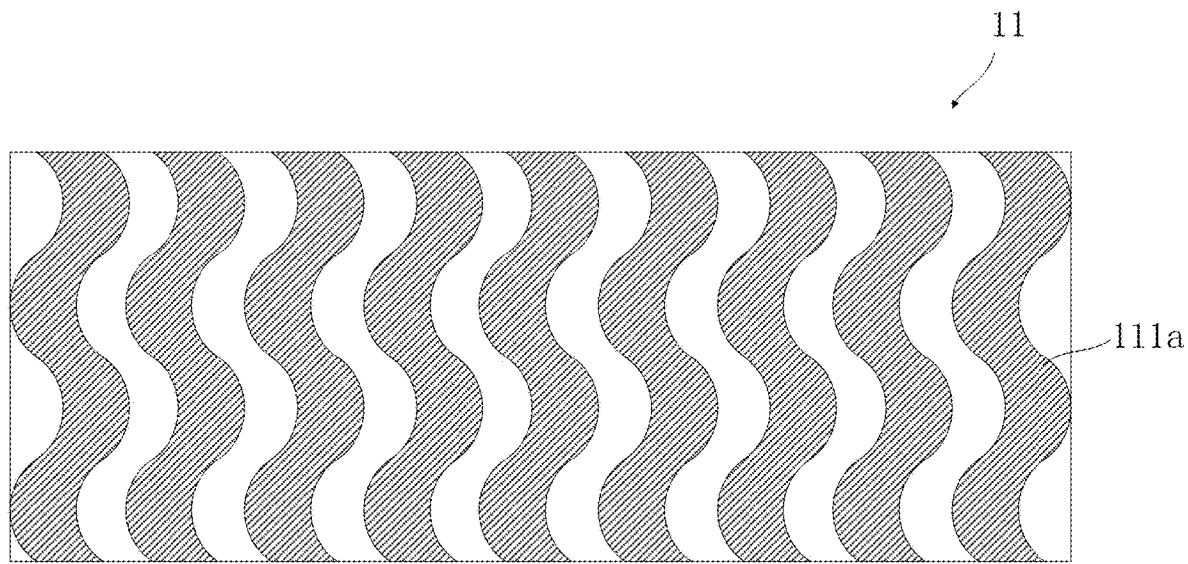
FIG. 6 is a top view of a light-transmission anode in another OLED display panel.

As shown in FIG. 6, in the embodiment, the light-transmission anodes 111a are multiple columns of wave-shaped strip anodes; correspondingly, the light-transmission cathodes 111c (not shown) are multiple rows of wave-shaped strip cathodes. In a specific implementation process, the OLED light-emitting material layer 111b (not shown) has a same shape as the anode 111a.

In another embodiment, the OLED display panel 1 can also include one row and multiple columns of light-transmission anodes 111a, or one column and multiple rows of light-transmission anodes 111a, and the light-transmission cathode 111c is a planar electrode. For a situation where the light-transmission anodes 111a are arranged in one row and multiple columns, a first OLED sub-pixel 111 of a column of light-transmission anodes 111a can be selected by applying a voltage. For a situation where the light-transmission anodes 111a are arranged in multiple rows and one column, a first OLED sub-pixel 111 of a row of light-transmission anodes 111a can be selected by applying a voltage.

For solution b), the first OLED pixel units 11 arranged in an array have a pixel drive circuit which may be a conventional drive circuit such as 2T1C, 3T1C, 7T1C, etc., or may only include a 1T drive circuit that implements a switching function.

The semi-active drive mode differs from the active drive mode in that the pixel drive circuit only includes one switching transistor (1T). For solution c), a gate of the switching transistor is connected to the scan signal, a source is connected to a data line, and a drain is connected to the light-transmission anode 111a of the first OLED sub-pixel 111. The scan signal may, for example, come from the scan signal of the GIP circuit, and the data line is connected to the data signal channel of the display driver integrated chip (DDIC). The light-transmission cathode 111c is grounded.

Figure 7:
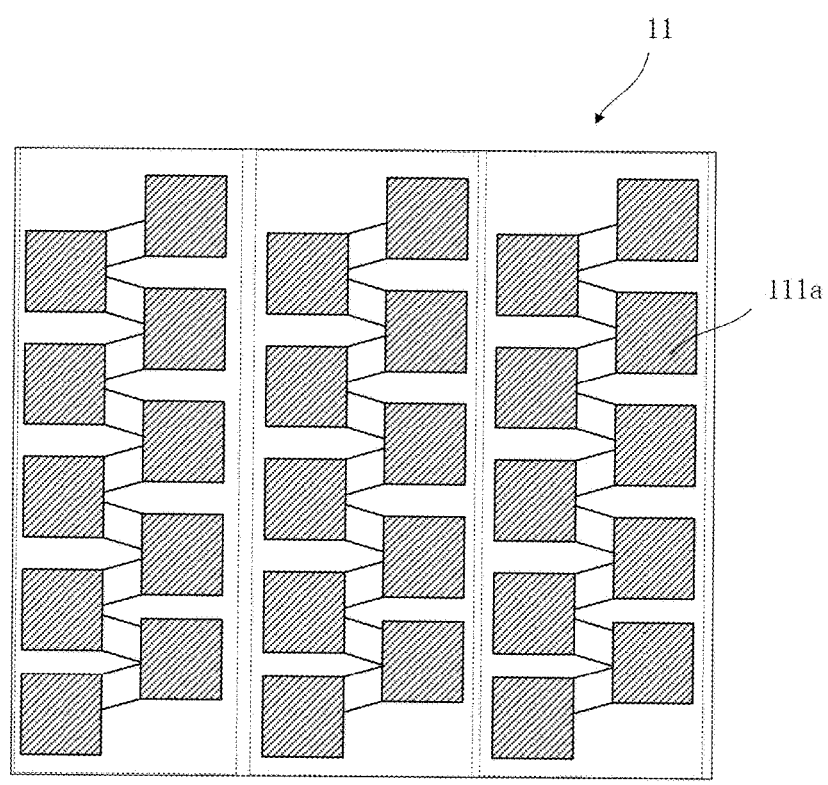
FIG. 7 is a top view of a light-transmission anode in another OLED display panel.

As shown in FIG. 7, in the embodiment, the light-transmission anodes 111a of the first OLED sub-pixels 111 in different columns are independent block anodes, and the block anodes are connected together by connecting parts. As shown in FIGS. 4 and 5, each block anode can be circular, elliptic, dumbbell-shaped, or gourd-shaped.

The drive mode of each column of first OLED sub-pixels 111 in FIG. 7 may be a Passive Matrix (PM) drive mode or an Active Matrix (AM) drive mode.

In other alternatives, the light-transmission anodes 111a of the first OLED sub-pixels 111 in different rows are independent block anodes, and the block anodes are connected together by connecting parts. Each block anode, as shown in FIGS. 4 and 5, can be circular, elliptic, dumbbell-shaped, or gourd-shaped.

Figure 8:
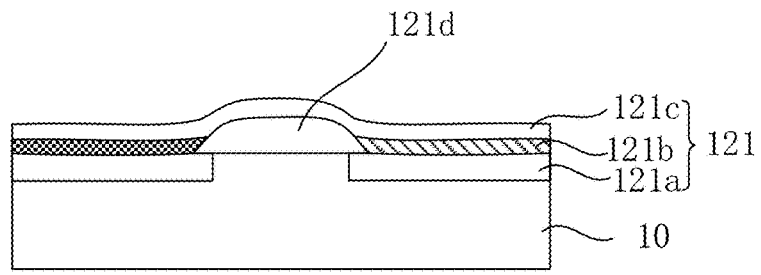
FIG. 8 is a cross-sectional view of the OLED display panel in FIG. 1 taken along a line 8-8, in which an encapsulation layer, a transparent filler layer, and a cover plate are omitted.

Referring to FIGS. 1 and 8, the second OLED pixel unit 12 includes a plurality of second OLED sub-pixels 121, and each second OLED sub-pixel 121 from bottom to top at least sequentially includes: a reflective anode 121a formed on the substrate 10, a pixel definition layer 121d provided with an opening, an OLED light-emitting material layer 121b located in the opening, and a light-transmission cathode 121c located on the OLED light-emitting material layer 121b.

A conventional thin film encapsulation (TFE) technology can be adopted for the encapsulation layer 13 which includes a multilayer organic and inorganic overlapping structure. The encapsulation layer 13 can prevent external water vapor and oxygen from entering the first OLED pixel unit 11 and the second OLED pixel unit 12, and avoid affecting the light-emitting efficiency of the OLED light-emitting material layers 111b and 121b.

The polarizer 14 can prevent light that enters the environment from the OLED display panel 1 from being reflected back into the OLED display panel 1. Accordingly, the interference of ambient light to the normal display of the OLED display panel 1 can be eliminated. A light transmittance of the transparent display area 10a can be improved by removing the polarizer 14 in the transparent display area 10a.

The cover plate 15 is configured to resist a scratch and protect an underlying structure.

In an embodiment, the transparent filler layer 16 is a cured Optically Clear Resin (OCR) or Liquid Optically Clear Adhesive (LOCA). Before the curing, both the OCR and LOCA are in a water state and have good fluidity, and thus have a strong filling ability.

Referring to FIG. 2, in order to restrict the flow of the liquid transparent filler that forms the transparent filler layer 16, in the embodiment where the opening 14a is not only enclosed by a side wall of the polarizer, the OLED display panel 1 further includes a barrier wall 17. The substrate 10 further has a frame area 10c located at one side of the transparent display area 10a away from the non-transparent display area 10b. The barrier wall 17 can be located in the frame area 10c.

Referring to FIG. 2, in order to improve the adhesion effect between the polarizer 14 and the cover plate 15, the OLED display panel 1 further includes a first transparent adhesive layer 18 provided between the polarizer 14 and the cover plate 15, and between the transparent filler layer 16 and the cover plate 15. The material of the first transparent adhesive layer 18 can be an Optically Clear Adhesive (OCA).

Figure 9:
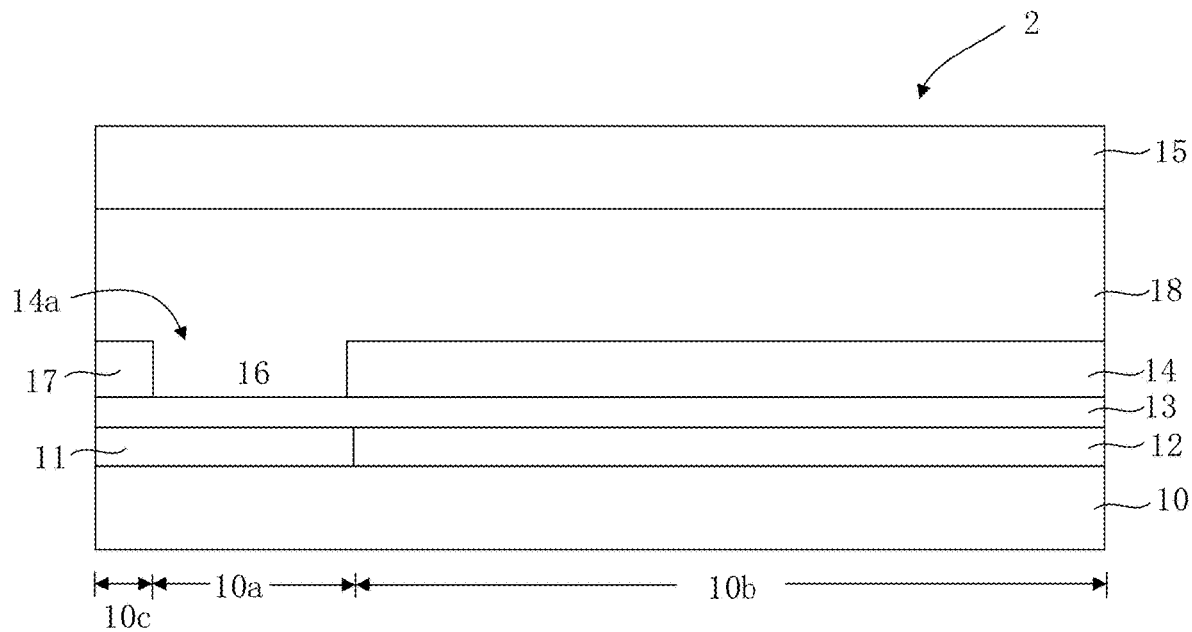
FIG. 9 is a schematic diagram illustrating a cross-sectional structure of an OLED display panel according to an embodiment II of the present disclosure.

Referring to FIGS. 9 and 2, it can be seen that the structure of the OLED display panel 2 in the present embodiment is substantially the same as that of the OLED display panel 1 in the embodiment of FIG. 2, except that the first transparent adhesive layer 18 fills the opening of the polarizer to form the transparent filler layer 16.

Compared to the OLED display panel 1 in the embodiment of FIG. 2, in which the transparent filler layer 16 is formed in the opening 14a of the polarizer first and then the first transparent adhesive layer 18 and the cover plate 15 are sequentially arranged on the polarizer 14 and the transparent filler layer 16, in the present embodiment, the step of first forming the transparent filler layer 16 in the opening 14a of the polarizer is omitted, but the first transparent adhesive layer 18 is directly arranged on the polarizer 14, and then the transparent filler layer 16 is formed by using a portion of the first transparent adhesive layer 18 entering the opening 14a of the polarizer, thus the procedure has fewer steps and is simple.

In the embodiment, a thickness of the first transparent adhesive layer 18 is greater than twice a thickness of the polarizer 14. Alternatively, the thickness of the first transparent adhesive layer 18 is greater than three times the thickness of the polarizer 14.

Figure 10:
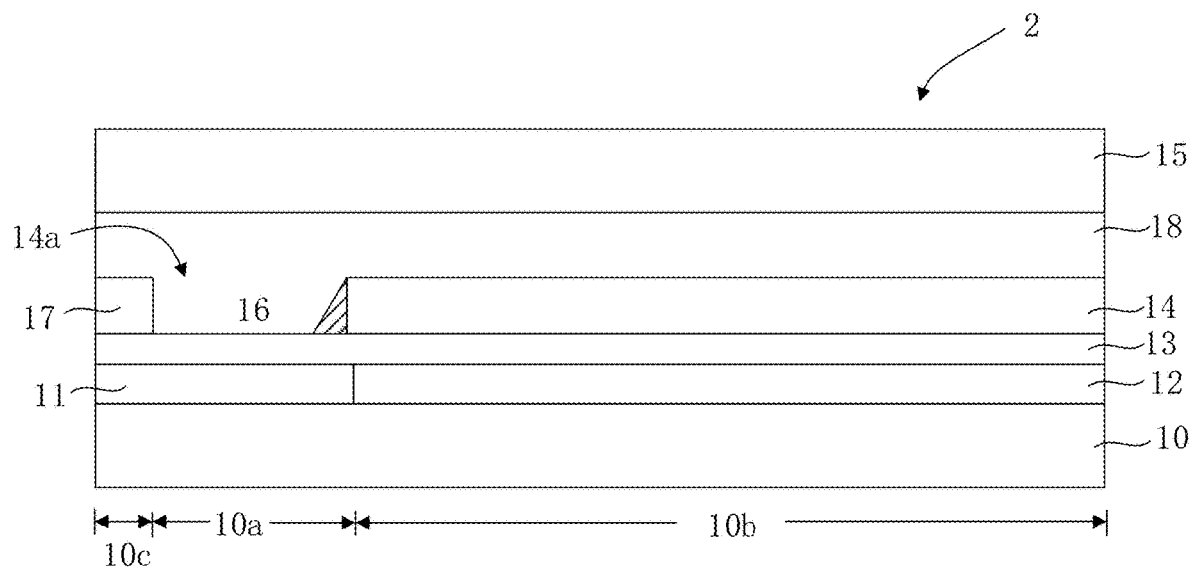
FIG. 10 is a schematic diagram of an embodiment in comparison with the embodiment II of FIG. 9.

Referring to FIG. 10, the thinner the first transparent adhesive layer 18 is, the more likely it is that the first transparent adhesive layer 18 is cured before the opening of the polarizer 14 having a shoulder height difference is fully covered (see a shaded area in FIG. 10). The thicker the first transparent adhesive layer 18 is, the more likely it can be cured after the opening of the polarizer 14 having the shoulder height difference is fully covered.

Figure 11:
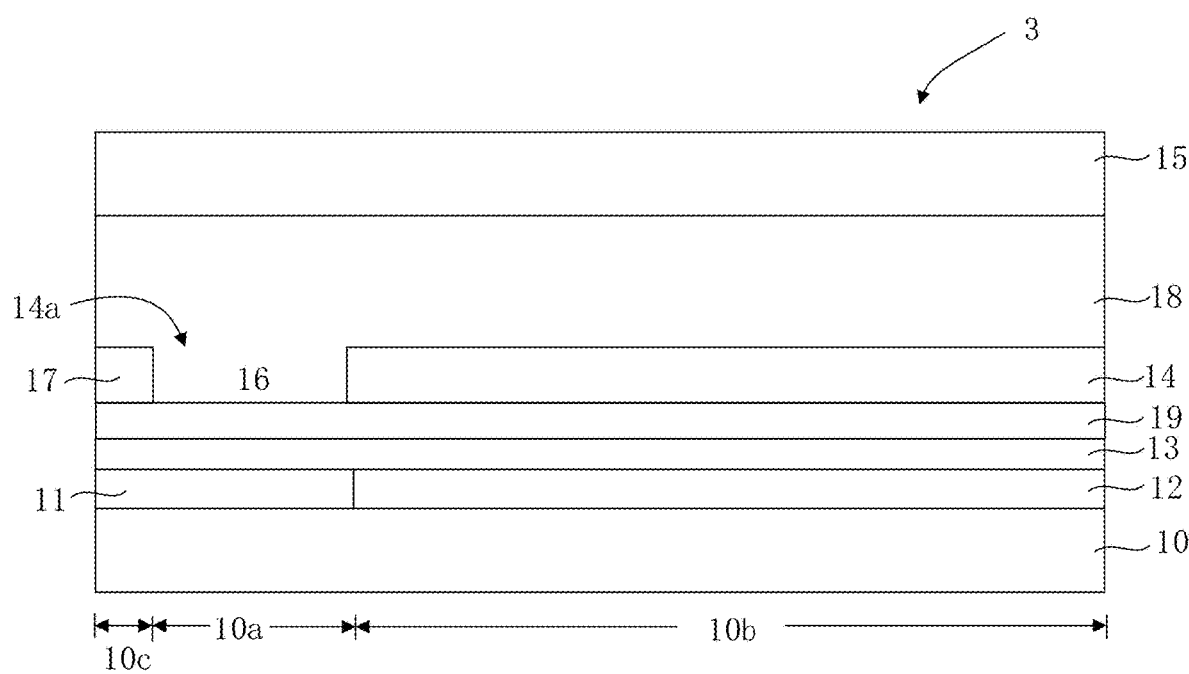
FIG. 11 is a schematic diagram illustrating a cross-sectional structure of an OLED display panel according to an embodiment III of the present disclosure.

Referring to FIGS. 11 and 9, it can be seen that the structure of the OLED display panel 3 in the present embodiment is substantially the same as that of the OLED display panel 2 in the embodiment of FIG. 9, except that the encapsulation layer 13 has a whole surface of a second transparent adhesive layer 19.

The second transparent adhesive layer 19 can enhance the adhesion effect between the encapsulation layer 13 and the polarizer 14.

Figure 12:
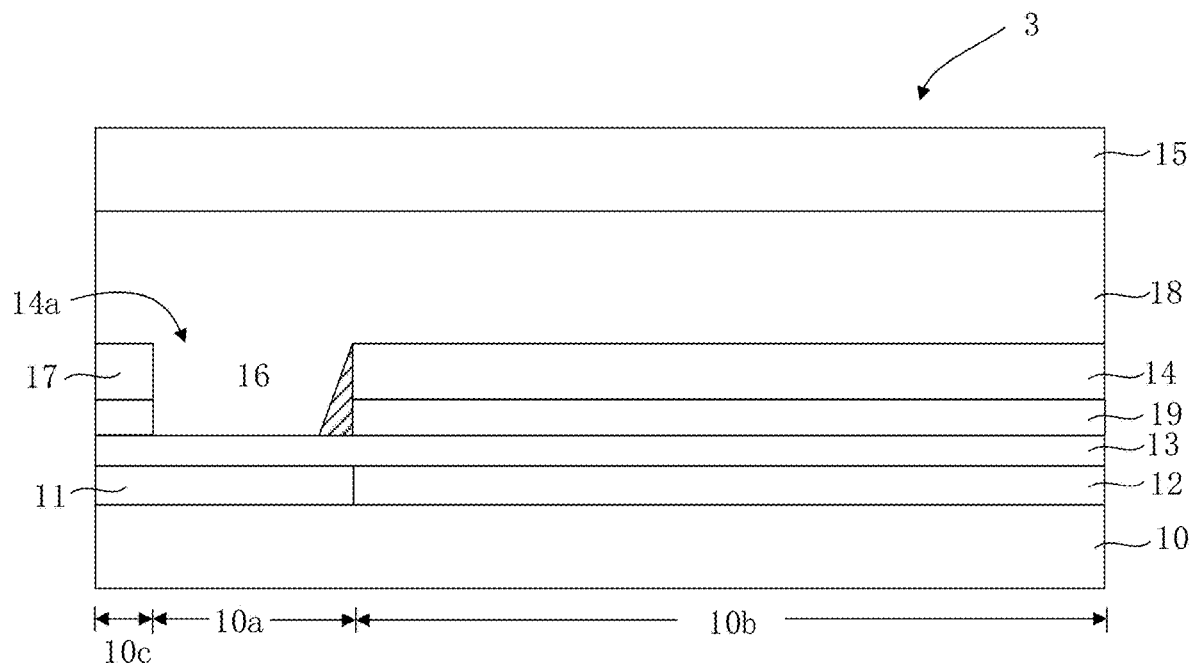
FIG. 12 is a schematic diagram of an embodiment in comparison with the embodiment III of FIG. 11.

Referring to FIGS. 11 and 12, compared to the embodiment of FIG. 12 in which a second transparent adhesive layer 19 having the same surface size with the polarizer 14 is provided under the polarizer 14, in the embodiment of FIG. 11, a second transparent adhesive layer 19 in a full panel size is provided under the polarizer 14, which can reduce the shoulder height difference of the opening 14a to be filled with the first transparent adhesive layer 18, thereby avoiding a phenomenon that the first transparent adhesive layer 18 is cured before the opening of the polarizer 14 having the shoulder height difference is fully covered (see a shaded area in FIG. 12). In other words, the smaller the shoulder height difference of the opening 14a is, the better the filling effect.

The embodiment can also be combined with the OLED display panel 1 in the embodiment of FIG. 2.

Figure 13:
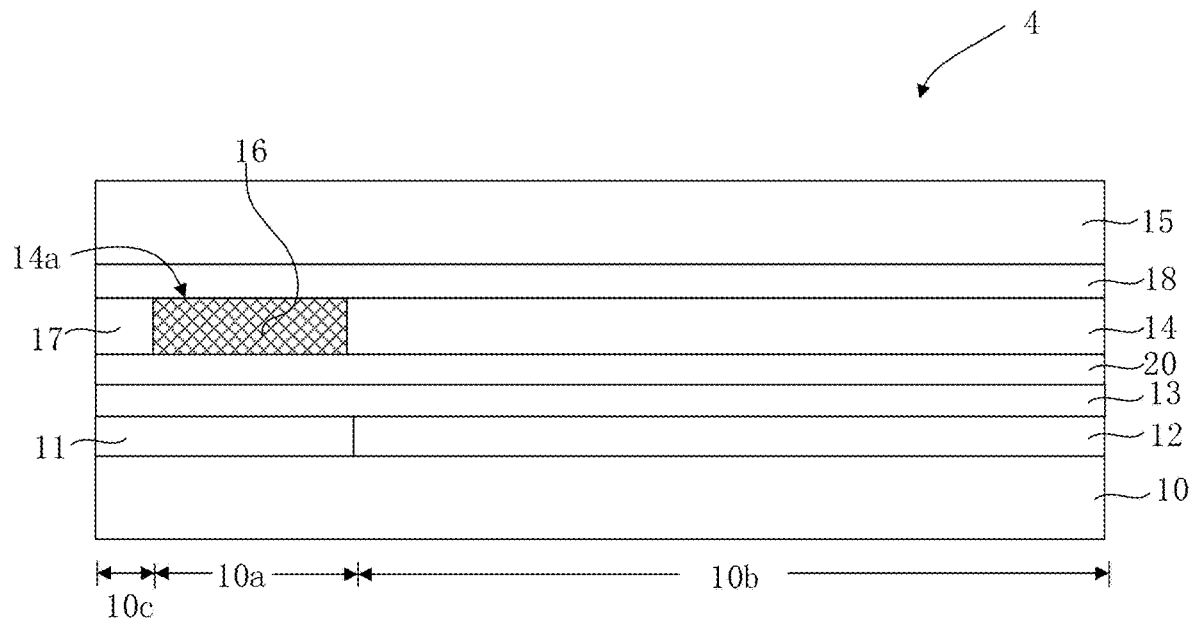
FIG. 13 is a schematic diagram illustrating a cross-sectional structure of an OLED display panel according to an embodiment IV of the present disclosure.

Referring to FIGS. 2 and 13, it can be seen that the structure of the OLED display panel 4 in the present embodiment is substantially the same as that of the OLED display panel 1 in the embodiment in FIG. 2, except that a touch layer 20 is provided between the encapsulation layer 13 and the polarizer 14 to implement a touch function.

In the embodiment, an area of the touch layer 20 corresponding to the transparent display area 10a has no opening, so as to reduce the shoulder height difference.

In the embodiment, the area of the touch layer 20 corresponding to the transparent display area 10a has no touch structure, so as to increase the light transmittance of the transparent display area 10a.

Figure 14:
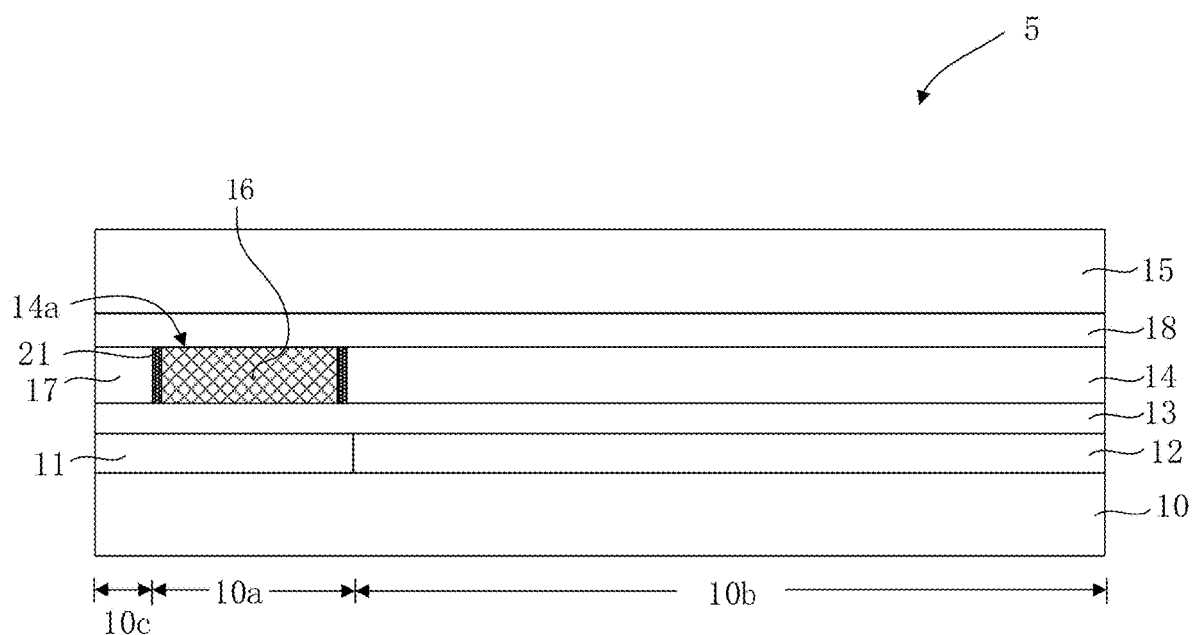
FIG. 14 is a schematic diagram illustrating a cross-sectional structure of an OLED display panel according to an embodiment V of the present disclosure.

Referring to FIGS. 2 and 14, it can be seen that the structure of the OLED display panel 5 in the present embodiment is substantially the same as that of the OLED display panel 1 in the embodiment of FIG. 2, except that the opening 14a is enclosed by the side wall of the polarizer 14 and the barrier wall 17, and the side wall of the polarizer 14 and/or a side wall of the barrier wall 17 have a light shielding layer 21.

With reference to FIGS. 1, 2 and 14, the light shielding layer 21 can prevent light leakage at the edge of the opening 14a of the polarizer when the first OLED sub-pixel 111 and the second OLED sub-pixel 121 emit light, which may affect the display effect mutually, or can prevent the light leakage at the opening 14a of the polarizer when only the second OLED sub-pixel 121 emits light.

In an alternative embodiment, the light shielding layer 21 can be made of a black matrix material or a black support column material.

For the structure in which the opening 14a is enclosed only by the side wall of the polarizer 14, the light shielding layer 21 is provided on the side wall of the polarizer 14.

Based on the aforementioned OLED display panel 1, 2, 3, 4, or 5, the present disclosure further provides a display device.

The display device can be a mobile phone, a tablet computer, a vehicle display screen, etc.

The display device includes:
a device body having a device area; and
the aforementioned OLED display panel 1/2/3/4/5, which covers the device body;
the device area is located under the transparent display area 10a of the OLED display panel 1/2/3/4/5, and a photosensitive device that emits or collects light through the transparent display area 10a is provided in the device area.

The photosensitive device includes a camera and/or a light sensor. The light sensor includes one or a combination of an iris recognition sensor and a fingerprint recognition sensor.

The above-mentioned embodiments are merely several exemplary embodiments, and the present disclosure is not limited to these embodiments. Any person skilled in the art can make various changes and modifications without departing from the spirit and scope of the present disclosure. Therefore, the scope of protection of the present disclosure shall be subject to claims.

What is claimed is:

1. An Organic Light Emitting Diode (OLED) display panel, comprising:
a substrate, comprising a transparent display area and a non-transparent display area;
a plurality of first OLED pixel units, arranged in an array and located in the transparent display area;
a plurality of second OLED pixel units, located in the non-transparent display area;
an encapsulation layer, covering the plurality of first OLED pixel units and the plurality of second OLED pixel units;
a polarizer, located on the encapsulation layer and provided with an opening corresponding to the transparent display area; and
a cover plate, located on the polarizer;
wherein the opening of the polarizer is filled with a transparent filler to form a transparent filler layer;
wherein a touch layer is provided between the encapsulation layer and the polarizer, an area of the touch layer corresponding to the transparent display area has no touch structure;
the opening is enclosed by the side wall of the polarizer and a barrier wall, the side wall of the polarizer and a side wall of the barrier wall have a light shielding layer; and
wherein each of the plurality of first OLED pixel units comprises one row and multiple columns of light-transmission anodes, or one column and multiple rows of light-transmission anodes, and a light-transmission cathode is a planar electrode.

2. The OLED display panel according to claim 1, wherein each first OLED pixel units comprises a plurality of first OLED sub-pixels, each first OLED sub-pixel at least comprises: a light-transmission anode, an OLED light-emitting material layer located on the light-transmission anode, and a light-transmission cathode located on the OLED light-emitting material layer, and the first OLED pixel unit is configured to perform a display function when there is a driving voltage applied between the light-transmission anode and the light-transmission cathode of the each first OLED sub-pixel, and perform a light-transmission function when there is no driving voltage applied between the light-transmission anode and the light-transmission cathode of the each first OLED sub-pixel.

3. The OLED display panel according to claim 2, wherein light-transmission anodes of different first OLED sub-pixels are independent block anodes, and a shaped of each block anode is circular, elliptic, dumbbell-shaped, or gourd-shaped.

4. The OLED display panel according to claim 1, wherein the first OLED pixel unit has a Passive Matrix (PM) drive mode, and the first OLED display unit comprises multiple rows of light-transmission anodes and multiple columns of light-transmission cathodes, or comprises multiple columns of light-transmission anodes and multiple rows of light-transmission cathodes.

5. The OLED display panel according to claim 4, wherein the light-transmission anode has a wave-shaped strip anode, and the light-transmission cathode has a wave-shaped strip cathode.

6. The OLED display panel according to claim 1, wherein the first OLED pixel unit has a Passive Matrix (PM) drive mode or an Active Matrix (AM) drive mode.

7. The OLED display panel according to claim 6, wherein each column of light-transmission anodes or each row of light-transmission anodes comprises a plurality of block anodes electrically connected to each other, and a shaped of each block anode is circular, elliptic, dumbbell-shaped, or gourd-shaped.

8. The OLED display panel according to claim 6, wherein the first OLED pixel unit has the AM drive mode, and a pixel drive circuit is provided between the substrate and the light-transmission anode and is configured to drive the first OLED pixel unit to perform a display function.

9. The OLED display panel according to claim 1, wherein a first transparent adhesive layer is respectively provided between the polarizer and the cover plate, and between the transparent filler layer and the cover plate; and a second transparent adhesive layer is respectively provided between the polarizer and the encapsulation layer, and between the transparent filler layer and the encapsulation layer; and a thickness of the first transparent adhesive layer is greater than three times a thickness of the polarizer.

10. The OLED display panel according to claim 1, wherein a first transparent adhesive layer is provided between the polarizer and the cover plate, the first transparent adhesive layer and the transparent filler layer filled in the opening of the polarizer have a same material and are formed at the same time.

11. The OLED display panel according to claim 10, wherein a second transparent adhesive layer is respectively provided between the polarizer and the encapsulation layer, and between the transparent filler layer and the encapsulation layer.

12. The OLED display panel according to claim 1, wherein the opening is rectangle, and a side of the opening is located at the boundary between the transparent display area and the non-transparent display area.

13. The OLED display panel according to claim 1, wherein the substrate further has a frame area located at one side of the transparent display area away from the non-transparent display area, the barrier wall is located in the frame area.

14. The OLED display panel according to claim 1, wherein a material of the light shielding layer is a black matrix material or a black support column material.

15. A display device, comprising:
a device body having a device area; and
an OLED display panel according to claim 1, the OLED display panel covering the device body;
wherein the device area is located under the transparent display area of the OLED display panel, and a photosensitive device emitting or collecting light through the transparent display area is provided in the device area.

16. The display device according to claim 15, wherein the photosensitive device comprises a camera and/or a light sensor.

17. The OLED display panel according to claim 1, wherein the substrate further has a frame area located at one side of the transparent display area away from the non-transparent display area, a side of the opening near the frame area is enclosed by the side wall of the barrier wall, and three sides of the opening near the non-transparent display area are enclosed by the side wall of the polarizer.

18. An Organic Light Emitting Diode (OLED) display panel, comprising:
a substrate, comprising a transparent display area and a non-transparent display area;
a plurality of first OLED pixel units, arranged in an array and located in the transparent display area; a plurality of second OLED pixel units, located in the non-transparent display area; an encapsulation layer, covering the plurality of first OLED pixel units and the plurality of second OLED pixel units;
a touch layer;
a cover plate, located on the side of the touch layer away from the substrate;
wherein an area of the touch layer corresponding to the transparent display area has no opening; and
wherein each of the plurality of first OLED pixel units comprises one row and multiple columns of anodes, or one column and multiple rows of anodes, and a cathode is a planar electrode; and
each first OLED pixel unit comprises a plurality of first OLED sub-pixels, anodes of different first OLED sub-pixels are independent block anodes, and the first OLED pixel unit has an Active Matrix (AM) drive mode.

19. The OLED display panel according to claim 18, wherein a plurality of pixel drive circuits are provided between the substrate and the anodes and are configured to drive the plurality of first OLED pixel units to perform a display function.

\* \* \* \* \*